United States Patent
Sriadibhatla et al.

(10) Patent No.: US 8,422,319 B2
(45) Date of Patent: Apr. 16, 2013

(54) SYSTEM AND METHOD FOR GATE TRAINING IN A MEMORY SYSTEM

(75) Inventors: Srinivas Sriadibhatla, Kamataka (IN); Curtis Matheson Webster, San Ramon, CA (US)

(73) Assignee: LSI Corporation, San Jose, CA (US)

( * ) Notice: Subject to any disclaimer, the term of this patent is extended or adjusted under 35 U.S.C. 154(b) by 199 days.

(21) Appl. No.: 13/118,499

(22) Filed: May 30, 2011

(65) Prior Publication Data

US 2012/0307577 A1    Dec. 6, 2012

(51) Int. Cl.
G11C 7/00    (2006.01)

(52) U.S. Cl.
USPC ........................ 365/193; 365/194; 365/233.11

(58) Field of Classification Search .................. 365/193, 365/194, 195, 233.1, 233.11, 189.07, 189.08, 365/189.2

See application file for complete search history.

(56) References Cited

U.S. PATENT DOCUMENTS

| | | | |
|---|---|---|---|
| 6,791,888 B2 * | 9/2004 | Kang | 365/193 |
| 6,819,599 B2 * | 11/2004 | Schaefer | 365/189.07 |
| 7,031,222 B1 * | 4/2006 | Charagulla et al. | 365/154 |
| 2010/0188906 A1 * | 7/2010 | Johnson et al. | 365/189.05 |
| 2010/0246290 A1 | 9/2010 | MacLaren et al. | |

* cited by examiner

*Primary Examiner* — Richard Elms
*Assistant Examiner* — Hien Nguyen
(74) *Attorney, Agent, or Firm* — Mendelsohn, Drucker & Associates, P.C.; Steve Mendelsohn

(57) ABSTRACT

A system and method for gate training in a memory system is disclosed. In one embodiment, in a method for calibrating read data strobe gating, a first read command is issued to a memory module. A first DQS gate signal is issued before the beginning of the preamble of a first DQS signal received from the memory module that corresponds to the first read command. A second read command is issued to the memory module such that the preamble of a second DQS signal received from the memory module that corresponds to the second read command is adjacent to the postamble of the first DQS signal. Then, a second DQS gate signal is issued at a preset time after the first DQS gate signal. The second DQS signal is sampled repeatedly to locate the preamble of the second DQS signal.

12 Claims, 5 Drawing Sheets

US 8,422,319 B2

SYSTEM AND METHOD FOR GATE TRAINING IN A MEMORY SYSTEM

FIELD OF TECHNOLOGY

Embodiments of the present invention relate to memory systems generally. More particularly, embodiments of the present invention relate to strobe gate signal training for synchronous memory systems like double data rate (DDR) memory systems.

BACKGROUND

Memory modules like double data rate (DDR) synchronous dynamic random access memory (SDRAM) are a class of memory capable of providing approximately twice the bandwidth of single data rate SDRAM. DDR SDRAM achieves this increased bandwidth without requiring an increased clock frequency by transferring data on both rising and falling edges of a clock signal. Therefore, the DDR SDRAM is often used in the design of integrated circuits.

A typical DDR memory subsystem includes a memory controller, a physical interface (sometimes referred to as PHY) and the memory modules, for example, DDR memory modules. The memory controller is coupled to the PHY and the PHY is coupled to the memory modules. The memory controller includes an arbiter and a protocol engine. The memory controller receives requests from various system elements of a computing system like processors and input-output (IO) devices. The memory controller processes the received request through an arbitration mechanism, using the arbiter. The protocol engine of the memory controller performs address translation, command scheduling and converts the requests into a sequence of DRAM commands. Then, the address and command along with the data are sent to the PHY.

The PHY receives the data from the memory controller at single data rate (SDR) and converts the data into double data rate (DDR), generates a data strobe (DQS), data queue (DQ) and sends the data to the DDR memory module along with the address and command data.

During a read operation from the memory modules, the PHY receives data at double data rate along with a DQS signal. The PHY converts the received data into single data rate and sends the data to the memory controller.

The PHY also contains delay lines and state machines to control and align skew between the data, strobe signals and the address/command lines using different training routines. The times at which the read data is latched are preferably synchronized relative to the DQS signal so as to latch the read data in the middle of valid data window. A gate signal is used to enable the DQS signal so that correct DQS edges are used. In general, determining the delay to be used in issuing the gate signal is known as gate training.

Existing techniques for gate training may not efficiently determine the delay to be used.

SUMMARY

A system and method for gate training in a memory system is described. According to one aspect of the present invention, in a method for calibrating read data strobe gating, a first read command is issued to a memory module. A first DQS gate signal is issued before the beginning of the preamble of a first DQS received from the memory module that corresponds to the first read command. A second read command is issued to the memory module such that the preamble of the second DQS signal received from the memory module that corresponds to the second read command is adjacent to the postamble of the first DQS signal. Then, a second DQS gate signal is issued at a preset time after the first DQS gate signal. The second DQS signal is sampled repeatedly to locate the preamble of the second DQS signal.

According to another aspect of the present invention, a non-transitory computer readable storage medium for calibrating read data strobe gating having instructions that, when executed by a computing device causes the computing device to perform the method as described above.

According to yet another aspect of the present invention, a system for calibrating read data strobe gating includes a logic and an interface module. The logic is configured to issue a first read command and a second read command to a memory module, where the memory module is configured to receive the first read command and the second read command and respond with a first DQS signal and a second DQS signal respectively. The interface module is configured to receive the first DQS signal and the second DQS signal, and issue a first DQS gate signal and a second DQS gate signal. The first DQS gate signal is issued before the beginning of the preamble of the first DQS signal received from the memory module. The second read command is issued to the memory module such that the preamble of the second DQS signal received from the memory module is adjacent to the postamble of the first DQS signal. The second DQS gate signal is issued at a preset time after the first DQS gate signal. The second DQS signal is repeatedly sampled to locate the preamble of the second DQS signal.

BRIEF DESCRIPTION OF THE DRAWINGS

Various preferred embodiments are described herein with reference to the drawings, wherein.

The drawings described herein are for illustration purposes only and are not intended to limit the scope of the present invention in any way.

DETAILED DESCRIPTION

A system and method for gate training in a memory system is described. In the following detailed description of the embodiments of the present invention, reference is made to the accompanying drawings that form a part hereof, and in which are shown by way of illustration specific embodiments in which the present invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
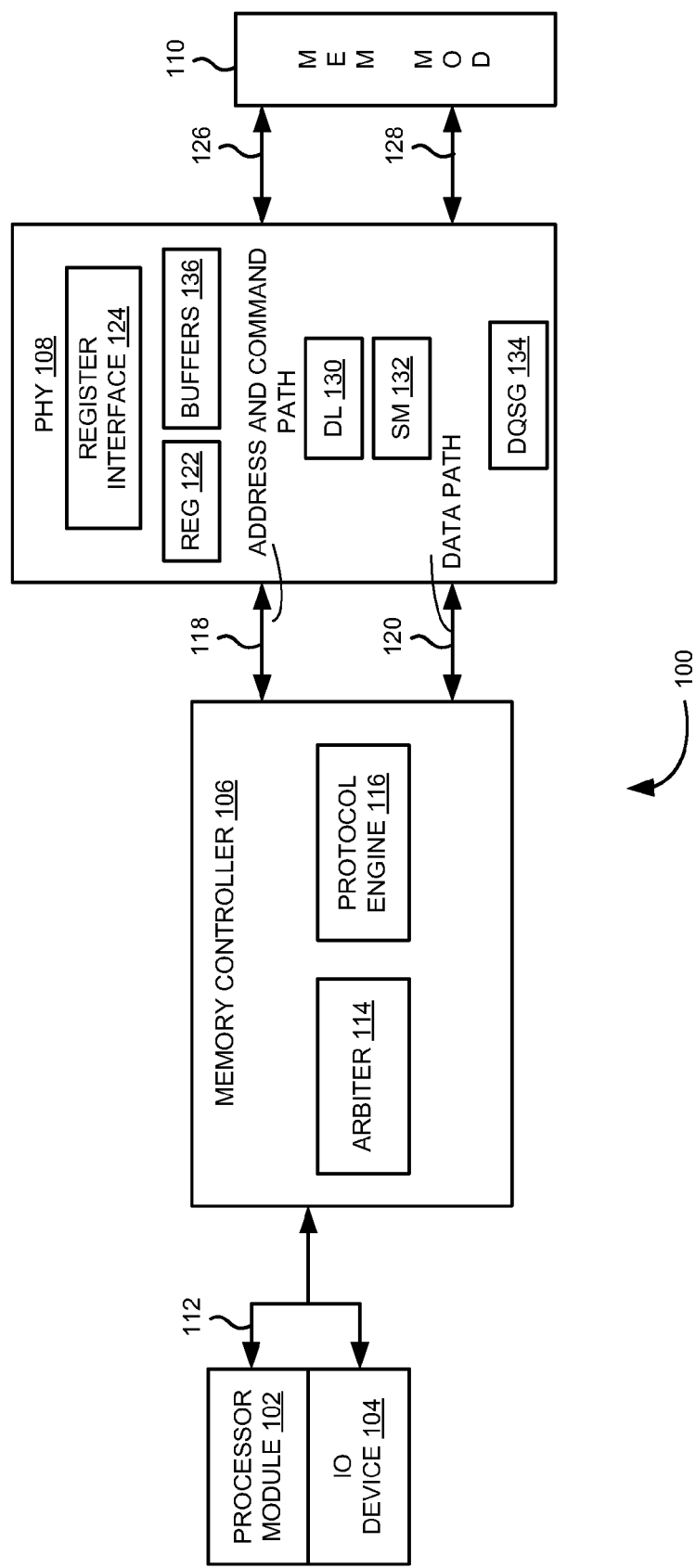
FIG. 1 illustrates an exemplary computer system with a memory system, according to an embodiment of this invention.

More particularly, FIG. 1 is an exemplary computing system. The computing system 100 includes one or more system elements 102-104, a memory controller 106, a physical interface 108 (sometimes referred to as PHY) and a memory module 110.

The system elements 102-104 may be processors or I/O devices issuing requests (for example, read requests and write requests) to the memory controller 106 over a bus 112. The memory controller 106 includes an arbiter 114 and a protocol engine 116. The memory controller 106 processes the received request through an arbitration mechanism, using the arbiter 114. The protocol engine 116 of the memory controller 106 performs address translation, command scheduling and converts the requests into a sequence of DRAM commands. Then, the address and DRAM commands along with the data are sent to the PHY 108.

The memory controller 106 is coupled to the PHY 108 over a link, which may include a plurality of paths, for example, an address/command path 118 and a data path 120. The PHY 108 may further include a plurality of registers 122 to store various values and a register interface 124 to access the plurality of registers 122. The PHY 108 is coupled to the memory module 110 over a memory link, which may include a plurality of paths, for example, a memory address/command path 126 and a memory data path 128. The PHY 108 additionally contains buffers 136 to store data received from the memory controller 106 and the memory module 110.

The PHY 108 receives the data from the memory controller 106 at single data rate (SDR) and converts the data into double data rate (DDR), generates a data strobe (DQS) signal, data queue (DQ) signal and sends the data to the memory module 110 along with the address and command data.

During a read operation from the memory module 110, the PHY 108 receives data at double data rate over the memory link, converts the received data into single data rate, and sends the data to the memory controller 106.

The PHY 108 also contains delay lines 130 and state machines 132 to control and align skew between the data, strobe signal (DQS) and the address/command lines using different training routines. The times at which the read data is latched are preferably synchronized relative to the data strobe (DQS) signal so as to latch the read data in the middle of valid data window. A DQSG logic 134 generates the DQS gate signal that enables the DQS signal. The DQSG logic 134 may be configured to issue (or assert) DQS gate signal at different times and for different periods. In general, determining the delay to be used in issuing these signals is known as gate training.

As an example, when the system element 102 performs a write cycle to the memory module 110, it provides address, control, and data signals to the memory controller 106. The memory controller 106 receives the request from the system element 102, and performs a write operation with the memory module 110 via the PHY 108. The memory write operation results in memory location, indicated by the specified address, being updated with data value supplied by the system element 102. The command portion of signal over link 126 informs the memory module 110 that a write operation is to be performed. Memory DQS signal identifies to the memory module 110 when data DQ is ready to be written into the memory.

When the system element 102 performs a read cycle to the memory module 110, it provides address and control signals to the memory controller 106. The memory controller 106 receives the request from the system element 102, and performs a read operation with the memory module 110 via the PHY 108. The command portion of signal over link 126 informs the memory module 110 that a read operation is to be performed. The read operation accesses memory module 110 at the specified address and the memory module 110 responds by providing memory controller 106 with the requested data DQ and also provides memory DQS signal which informs the memory controller 106 that the requested data is available. After completing the read operation, the memory controller 106 provides the requested data to the system element 102.

Figure 2:
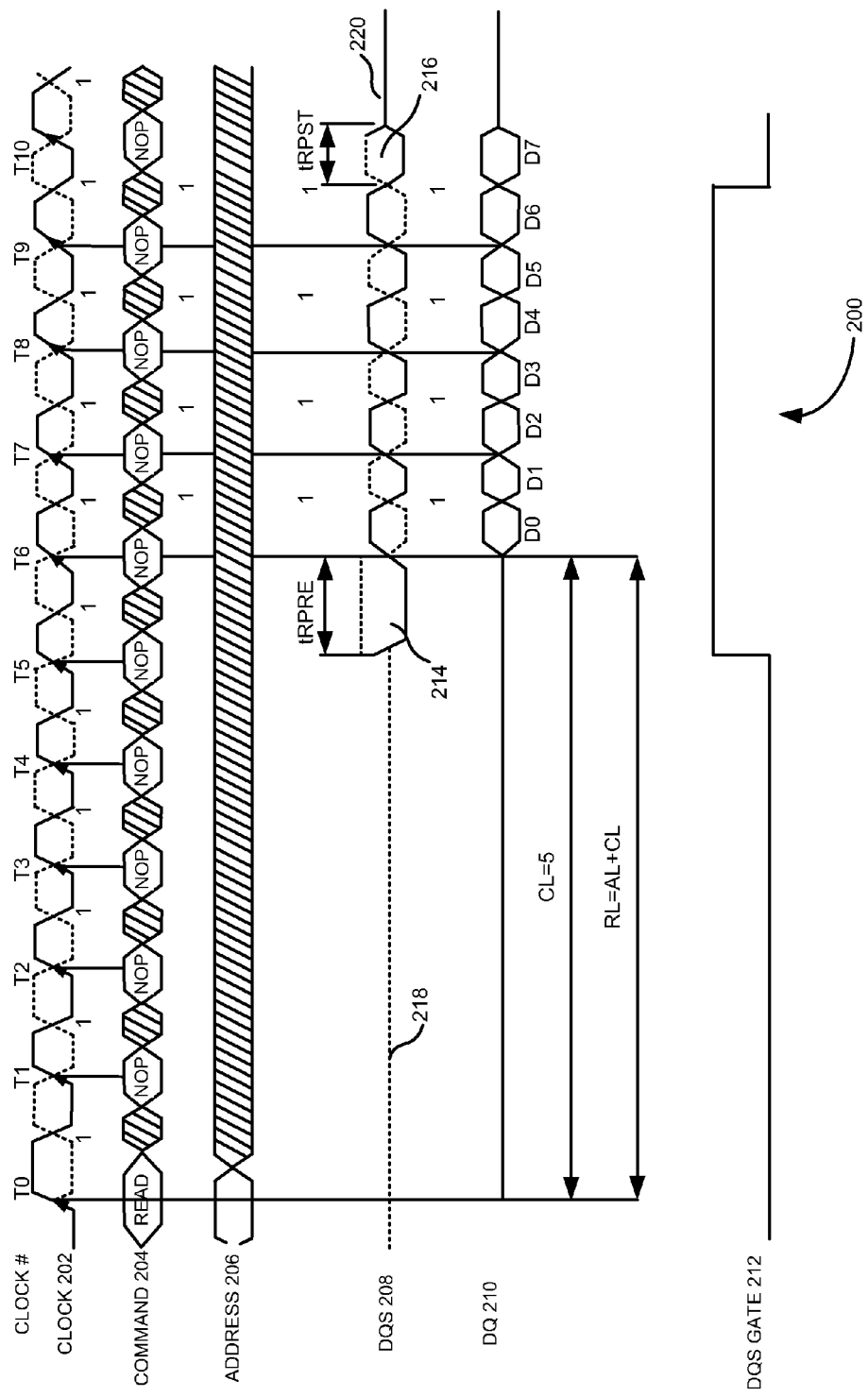
FIG. 2 illustrates a timing diagram for read data read from the memory module of the memory system, according to an embodiment of this invention.

FIG. 2 shows the timing diagram 200 for read data read from the memory module 110. As illustrated in FIG. 2, timing signals include an internal clock signal 202, a command signal 204, an address signal 206, a DQS signal 208, a read data DQ signal 210 and a DQS gate signal 212. The read data protocol for DDR memories is source synchronous. Thus, the DQS signal 208 initially is aligned with the read data DQ signal 210. Additionally, the read data DQ signal 210 includes eight beats of data, D0-D7, wherein a beat refers to data transferred during a single half clock cycle.

The DQS signal 208 is gated by the DQS gate signal 212. The DQS signal 208 includes a 1 clock cycle of preamble 214, followed by a plurality of ½ clock cycle transitions corresponding to the number of beats of data and then a postamble 216 of ½ a cycle. In DDR memories, for example, DDR2/3 memories, DQS signal remains in high impedance state (as shown at 218 and 220), except for the preamble 214, postamble 216, and active data burst period between the preamble 214 and the postamble 216.

The objective of a gate training procedure is to place the DQS gate signal 212 assertion (i.e., raising edge of the DQS gate signal 212 in the middle of the read DQS signal 208 preamble 214 by adjusting a gate delay line. In a PHY implementation, gate delay line has 1 clock, ½ clock and/or ¼ clock delay taps using sequential elements. Fine tuning of the gate delay may be achieved with combinational cells which offer a delay in the range of 15 ps to 4 ps, based on the technology, process used and cell architecture.

Referring back to FIG. 2, the preamble 214 is 1 clock cycle wide and postamble is ½ clock cycle wide. In order to identify the preamble 214, in one embodiment, the DQS signal 208 line is consecutively sampled in ¼ clock cycle increments and a three consecutive zero samples will indicate the preamble 214 portion of the DQS signal 208. Due to jitter on the DQS signal line, it is possible to erroneously read three consecutive zeros using ¼ clock cycles and erroneously conclude the presence of the preamble 214 in the DQS signal 208.

Since certain delays in transmission of signal, for example, due to trace delays in a printed circuit board are not known, the DQS gate signal 212 may be improperly asserted during a high impedance period of the DQS signal 208. Then, the sampled value of DQS signal is unpredictable and a small noise on the DQS signal line can cause the value to toggle either to a "1" or a "0". The memory controller 106 may not be able to determine the delay to be used for the DQS gate signal 212. It may take many iterations of gate training procedure to find the preamble of the DQS signal.

Figure 3:
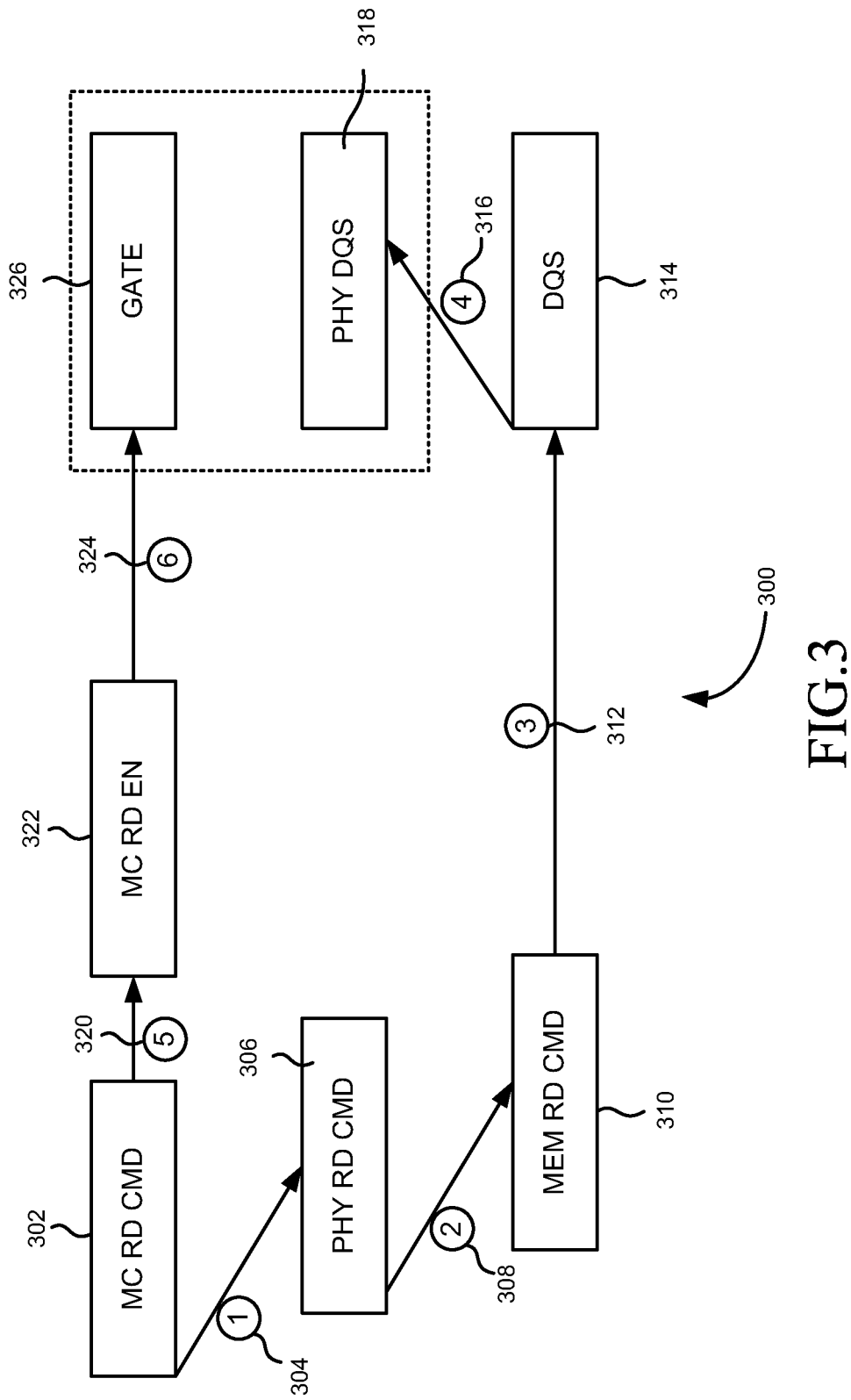
FIG. 3 illustrates various delays involved in processing a read command by the memory system, according to an embodiment of this invention.

Referring to FIG. 3, various delays involved in the processing of a read command and gate signal are described. In block 302, the memory controller issues a read command to the PHY. After a delay #1 304 through the PHY, the read command is issued by the PHY in block 306 to the memory module, which is received by memory module after delay #2 308. The memory module processes the read command in block 310 and after a delay #3 312, the memory controller asserts the DQS signal in block 314. The DQS signal asserted in block 314 is received by the PHY in block PHY DQS 318, after a delay #4 316. After a delay of delay #5 320, the memory controller issues a read data enable in block 322.

After a delay of delay #6 324, the PHY in block 322 issues the DQS gate signal in block 326.

Of the delays described above, the delay #2 308 and delay #4 316 are substantially attributable to the trace delay and are dependent upon the printed circuit board design and the memory module design. The delay #1 304 is substantially a fixed delay. The delay #3 312 is Column Address Strobe (CAS) latency and generally fixed for a specific memory configuration. The delay #5 320 and the delay #6 324 are delays set in the memory controller and the PHY respectively, which are known.

Figure 4:
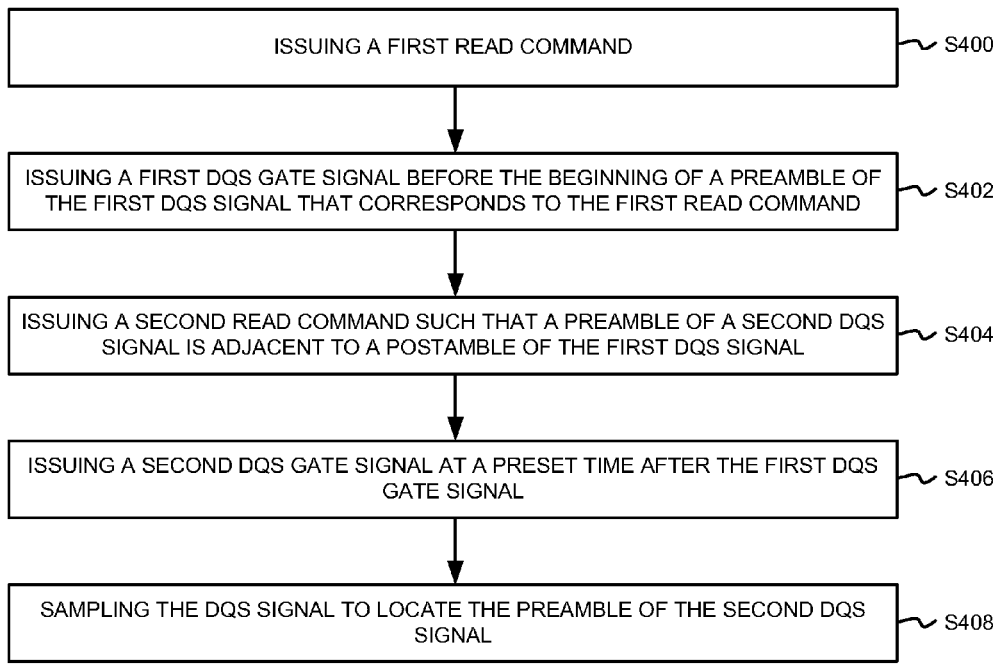
FIG. 4 illustrates a method of gate training according to an embodiment of this invention.
Figure 5:
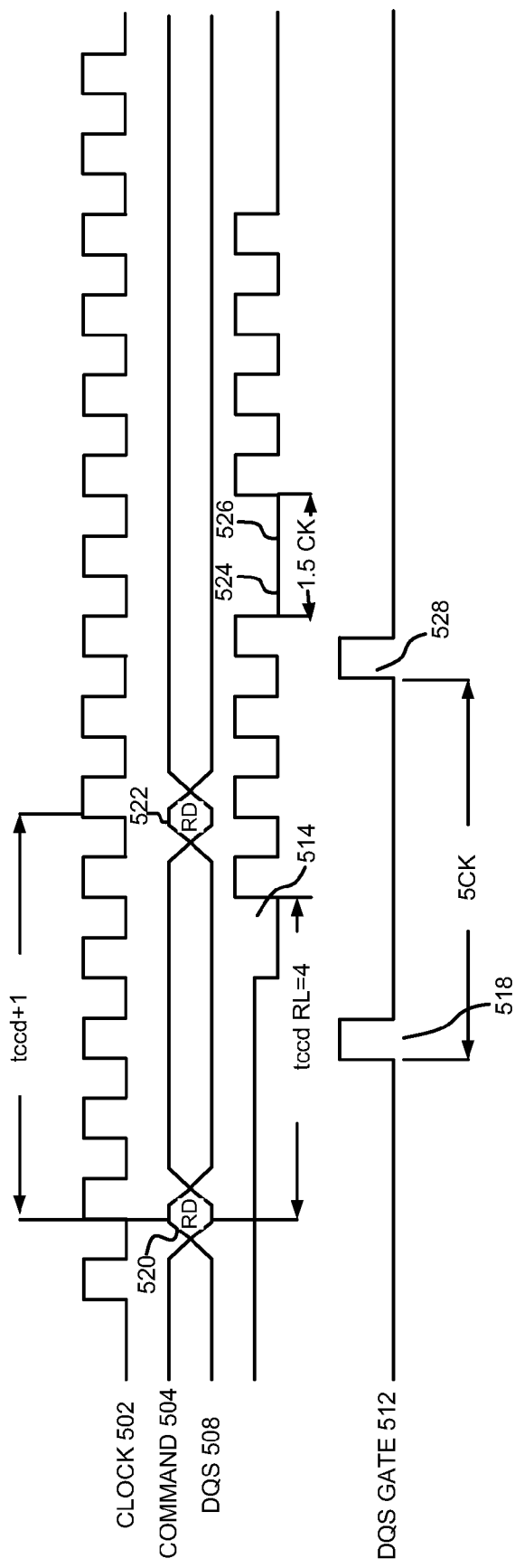
FIG. 5 illustrates an exemplary timing diagram for various signals that correspond to the read command issued according to the method of gate training illustrated in FIG. 4.

Now, referring to FIGS. 4 and 5, an embodiment of a method of gate training procedure is described. FIG. 4 shows an exemplary gate training method according to an embodiment. FIG. 5 shows a timing diagram 500 for various signals that correspond to a read data issued to the memory module, during a gate training procedure described with reference to FIG. 4. As illustrated in FIG. 5, the timing signals include an internal clock signal 502, a command signal 504, a DQS signal 508, and a DQS gate signal 512. For the purpose of gate training, the DQS gate signal 512 is used to sample the DQS signal. The signals shown in timing diagram 500 may be similar to the signals shown in timing diagram 200, for example, the internal clock signal 202 and the internal clock signal 502 may be similar. However, the DQS gate signal 512 is truncated so that it can be used to sample the DQS signal 508 for gate training, whereas the DQS gate signal 212 is shown in functional mode (not gate training mode) and is used to enable the DQS signal 208. Also some of the signals corresponding to the signals in timing diagram 200 are not shown in the timing diagram 500. For example, the address signal 206 and the data DQS signal 208 are not shown in the timing diagram 500.

Now, referring to FIG. 4, in block 400, a first read command is issued. For example, the memory controller 106 issues a first read command. In one embodiment, the memory controller 106 may be configured to generate the first read command. In one embodiment, one of the system modules, for example, the system element 102 may generate the first read command. The issuance of first read command is shown in FIG. 5, the command signal 504 at 520.

In block 402, a first DQS gate signal is issued before the beginning of the preamble of the first DQS signal that corresponds to the first read command. As an example, the DQSG logic 134 is configured to issue DQS gate signal before the beginning of the preamble of the first DQS signal that corresponds to the first read command.

Now, referring back to FIG. 3, we notice that the DQS signal is received (or arrives) at the PHY after a delay of delay #1+delay #2+delay #3+delay #4. In one embodiment, the delay #5 and delay #6 are set such that they are substantially equal to the delay #1 and the delay #3. In such a set up, the DQSG logic 134 issues the DQS gate signal after the delay #5 and the delay #6, which will enable the availability of the DQS signal before the arrival of the preamble of the DQS signal in PHY.

Now referring to the timing diagram 500 of FIG. 5. The assertion of the DQS gate signal 512 before the beginning of the preamble 514 of the first DQS signal that corresponds to the first read command is shown at 518.

Now, referring back to FIG. 4, in block S404, a second read command is issued such that the preamble of the second DQS signal is adjacent to the postamble of the first DQS signal. Referring to the timing diagram 500 of FIG. 5, the second read command is shown at 522, the postamble of the first DQS signal is shown at 524 and the preamble of the second DQS signal is shown at 526.

In one embodiment, the second read command is issued after a period of tCCD+1 clock cycles from the issuance of the first read command, where tCCD corresponds to four clock cycles. In this example, the second read command is issued 5 clock cycles after the issuance of the first read command as tCCD is equal to 4 clock cycles.

In block S406, a second DQS gate signal is issued after a preset time after the first DQS gate signal. In this example, the second DQS gate signal is issued after a preset time that corresponds to the tCCD+1 clock cycles. For example, the second DQS gate signal is issued after 5 clock cycles after the issuance of the first DQS gate signal. The issued (or asserted) second DQS gate signal is shown at 528 in the timing diagram 500 of FIG. 5. As one skilled in the art appreciates, the second DQS gate signal is asserted during the "data" portion of the first DQS signal and before the postamble of the first DQS signal. And, there will be 1½ cycles of "0"s in the DQS signal, as the postamble of the first DQS signal is adjacent to the preamble of the second DQS signal.

In block S408, the DQS signal is sampled repeatedly to locate the preamble of the second DQS signal. In one embodiment, DQS signal is sampled repeatedly in ¼ cycle increments so as to sample at least five consecutive "0"s. This will correspond to a position past the mid portion of the preamble of the second DQS signal. In one embodiment, the DQS gate signal may be switched periodically to produce a gate enable signal to sample the DQS signal repeatedly in ¼ cycle increments.

As an example, if in block S408, seven samples of DQS signal in ¼ cycle increments were needed to detect five consecutive "0"s, then, an additional delay of ½ cycle (corresponding to seven−five=two samples, with each sample ¼ cycles apart) needs to be added to assert DQS gate signal. This additional delay would position DQS gate signal past the mid position of the preamble of the DQS signal. In some embodiments, the additional delay may be slightly reduced (say by ⅛ clock cycle) so as to position the assertion of DQS gate signal closer to the mid position of the preamble of the DQS signal.

The present invention may also include a computer product which may be a storage medium including instructions which can be used to program a computing device to perform a process in accordance with the present invention. The storage medium can include, but not limited to, any type of disk including floppy disk, optical disk, CD-ROM, magneto-optical disks, ROMS, RAMs, EPROMs, EEPROMS, flash memory, magnetic or optical cards, or any type of media suitable for storing electronic instructions.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., complementary metal-oxide-semiconductor (CMOS) based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuit (ASIC)).

What is claimed is:

1. A method for calibrating read data strobe gating, comprising:
    issuing a first read command to a memory module;

issuing a first DQS gate signal before the beginning of the preamble of a first DQS signal received from the memory module that corresponds to the first read command;

issuing a second read command to the memory module such that the preamble of a second DQS signal received from the memory module that corresponds to the second read command is adjacent to the postamble of the first DQS signal;

issuing a second DQS gate signal at a preset time after the first DQS gate signal; and sampling the second DQS signal repeatedly to locate the preamble of the second DQS signal.

2. The method of claim 1, wherein the preamble is set to a first predetermined value for a first set period and the postamble is set to a second predetermined value for a second set period.

3. The method of claim 2, wherein the second DQS signal is repeatedly sampled at a fixed rate so as to read at least a plurality of times within the first set period and the second set period.

4. The method of claim 3, wherein the first predetermined value and the second predetermined value are set to a known value, and based on number of times DQS signal value read is same as the known value, the preamble of the second DQS signal is located.

5. The method of claim 4, wherein the first predetermined value and the second predetermined value are set to "0" and DQS signal is repeatedly read at a frequency so as to sample twice the number of times in the first set period as sampled in the second set period and the preamble of the second DQS signal is located when consecutive "0"s are read greater than twice the number of times sampled in the second set period.

6. The method of claim 5, wherein the second DQS signal is repeatedly read at a frequency so as to sample at least two times within the second set period and at least four times within the first set period and the preamble of the second DQS signal is located when five consecutive "0"s are read.

7. A non-transitory computer-readable storage medium for calibrating read data strobe gating having instructions that, when executed by a computing device causes the computing device to execute the method according to claim 1.

8. A system for calibrating read data strobe gating, comprising:

a logic configured to issue a first read command and a second read command to a memory module, wherein the memory module is configured to receive the first read command and the second read command and respond with a first DQS signal and a second DQS signal, respectively; and an interface module configured to receive the first DQS signal and the second DQS signal, and issue a first DQS gate signal and a second DQS gate signal, wherein;

the first DQS gate signal is issued before the beginning of the preamble of the first DQS signal received from the memory module;

the second read command is issued to the memory module such that the preamble of the second DQS signal received from the memory module is adjacent to the postamble of the first DQS signal;

the second DQS gate signal is issued at a preset time after the first DQS gate signal; and the second DQS signal is repeatedly read to locate the preamble of the second DQS signal.

9. The system of claim 8, wherein the preamble is set to a first predetermined value for a first set period and the postamble is set to a second predetermined value for a second set period.

10. The system of claim 9, wherein the second DQS signal is repeatedly read at a fixed rate so as to read at least a plurality of times within the first set of period and the second set of period.

11. The system of claim 10, wherein the first predetermined value and the second predetermined value are set to a known value, and based on number of times DQS signal value read is same as the known value, the preamble of the second DQS signal is located.

12. The system of claim 11, wherein the first predetermined value and the second predetermined value are set to "0" and the second DQS signal is repeatedly read at a frequency so as to sample twice the number of times in the first set period as sampled in the second set period and the preamble of the second DQS signal is located when consecutive "0"s are read greater than twice the number of times sampled in the second set period.

* * * * *